US 6,555,446 B1

(12) United States Patent
Unnikrishnan

(10) Patent No.: US 6,555,446 B1
(45) Date of Patent: Apr. 29, 2003

(54) BODY CONTACT SILICON-ON-INSULATOR TRANSISTOR AND METHOD

(75) Inventor: Sreenath Unnikrishnan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 141 days.

(21) Appl. No.: 09/692,010

(22) Filed: Oct. 19, 2000

Related U.S. Application Data
(60) Provisional application No. 60/170,289, filed on Dec. 10, 1999.

(51) Int. Cl.[7] .................................................. H01L 21/46
(52) U.S. Cl. ............................................................ 438/459
(58) Field of Search .................................. 438/459, 154, 438/305, 197

(56) References Cited

U.S. PATENT DOCUMENTS

| | | | | |
|---|---|---|---|---|
| 4,965,213 A | * | 10/1990 | Blake | |
| 5,811,855 A | * | 9/1998 | Tyson et al. | 257/349 |
| 6,060,364 A | * | 5/2000 | Maszara et al. | 438/305 |
| 6,238,960 B1 | * | 5/2001 | Maszara et al. | 438/197 |
| 6,261,879 B1 | * | 7/2001 | Houston et al. | 438/154 |

* cited by examiner

Primary Examiner—Caridad Everhart
Assistant Examiner—V. Yevsikov
(74) Attorney, Agent, or Firm—Jacqueline J. Garner; Wade James Brady, III; Frederick J. Telecky, Jr.

(57) ABSTRACT

A method for fabricating a body contact silicon-on-insulator transistor (10) includes forming a semiconductor substrate (12) over an insulator (14) and lightly doping the semiconductor substrate (12) to form a body region (18). The method also includes forming a gate (20) over the semiconductor substrate (12) and separated from the semiconductor substrate (12) by a gate insulator layer (21). The gate (20) defines a source region (22), a drain region (24) and a contact region (26). The method also includes masking a portion (36) of the gate (20) and the contact region (26) and heavily doping the source region (22), the drain region (24) and an unmasked portion (36) of the gate (20) with a material having a conductivity substantially opposite a conductivity of the body region (18).

13 Claims, 2 Drawing Sheets

BODY CONTACT SILICON-ON-INSULATOR TRANSISTOR AND METHOD

This application claims priority under 35 USC § 119(e)(1) of provisional application No. 60/170,289 filed Dec. 10, 1999.

TECHNICAL FIELD OF THE INVENTION

The present invention relates generally to the field of semiconductor fabrication and, more particularly, to a body contact silicon-on-insulator transistor and method.

BACKGROUND OF THE INVENTION

Because of fundamental limitations on bulk insulated gate field defect transistors (MOSFETS), operational improvement of present devices generally requires significantly changing the basic operation of the transistor. One important area of development over the last several years has been the use of silicon-on-insulator (SOI) transistors to improve performance of MOSFETS.

SOI transistors generally include a silicon semiconductor substrate deposited over an insulating layer. SOI transistors also generally include an electrically isolated body formed in the silicon semiconductor substrate and disposed beneath a gate region of the transistor. Thus, SOI transistors generally require a body contact for coupling the body of the SOI transistor to a fixed potential. For example, SOI transistors generally require connecting a p-type conductivity body, in the case of an n-channel MOSFET, or an n-type conductivity body, in the case of a p-channel MOSFET, to a fixed potential.

One method of connecting the body of the SOI transistor to a potential is to provide an edge contact to the body. Proving an edge contact to the body generally requires a T-shaped or H-shaped gate poly layout. However, T-shaped and H-shaped gate poly layouts generally add significant parasitic capacitance to the SOI transistor due to the portion of the poly layer not contributing to drive current of the transistor, especially if the gate electrode properties are generally uniform.

SUMMARY OF THE INVENTION

Accordingly, a need has arisen for an improved method for manufacturing a body contact silicon-on-insulator transistor. The present invention provides a method for manufacturing a body contact silicon-on-insulator transistor that addresses shortcomings of prior methods and transistors.

According to one embodiment of the present invention, a method for fabricating a body contact transistor includes providing a semiconductor substrate on an insulator and lightly doping the semiconductor substrate to form a body region. The method also includes forming a gate on an upwardly facing surface of the semiconductor substrate and separated from the upwardly facing surface of the semiconductor substrate by a gate insulator layer. The gate defines a source region, a drain region, and a contact region. The method further includes masking a portion of the gate and the contact region and heavily doping the source region, the drain region, and an unmasked portion of the gate with a material having a conductivity substantially opposite a conductivity of the body region. The method further includes heavily doping the contact region with a material having a conductivity substantially opposite to the conductivity of the source region and the drain region.

According to another embodiment of the present invention, a body contact transistor includes a body region of a first conductivity type formed over an insulator. The transistor also includes a source region and a drain region, each having a second conductivity type substantially opposite the first conductivity type. The source and drain regions are formed adjacent to the body region. The transistor further includes a gate formed over the body region and separated from the body region by a gate insulator layer. The gate includes a doped portion of a third conductivity type disposed adjacent the source region and the drain region. The third conductivity type is substantially opposite to the first conductivity type. The gate also includes an undoped portion disposed at an end of the gate and adjacent a contact region. The contact region is coupled to the body region.

Technical advantages of the present invention include substantially reducing the parasitic capacitance of a silicon-on-insulator transistor. For example, according to one aspect of the present invention, the gate of the transistor includes a doped portion and an undoped portion. The doped portion of the gate includes a conductivity type substantially opposite of a conductivity type of a body region of the transistor. Source and drain regions of the transistor are formed on either side of the doped portion of the gate. The undoped portion of the gate is disposed at an end of the gate and adjacent a contact region of the body. The undoped portion of the gate is electrically coupled to the doped portion of the gate through a silicide layer formed on an upwardly facing surface of the of the gate. Because of the creation of a depletion region in a portion of the gate proximate the gate insulator layer, the effective gate insulator thickness is increased, thereby substantially reducing the parasitic capacitance between the gate and the body region in the undoped portion region of the gate.

Other technical advantages will be readily apparent to one skilled in the art from the following figures, descriptions, and claims.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE INVENTION

Embodiments of the present invention and its advantages are best understood by referring to FIGS. 1 through 6 of the drawings, like numerals being used for like and corresponding parts of the various drawings.

Figure 1:
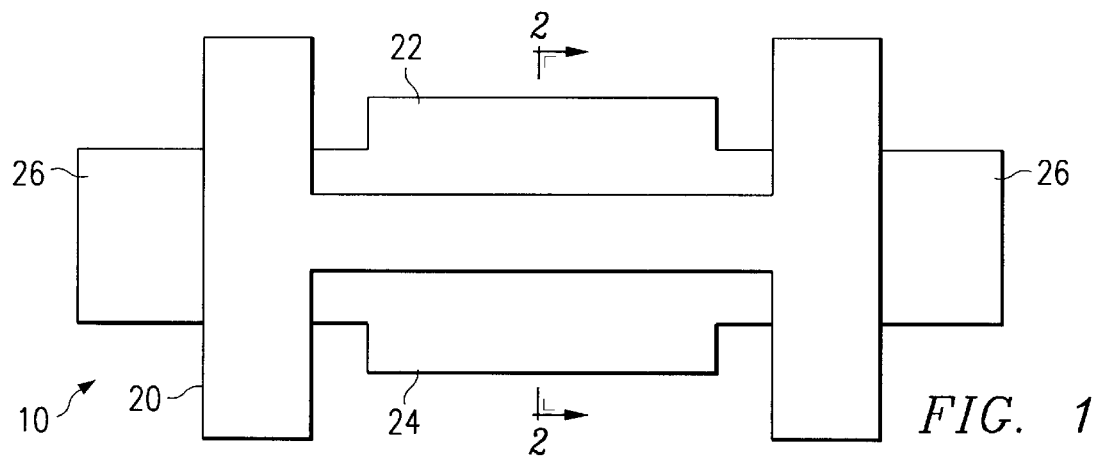
FIG. 1 is a diagram illustrating a silicon-on-insulator semiconductor device in accordance with an embodiment of the present invention.
Figure 2:
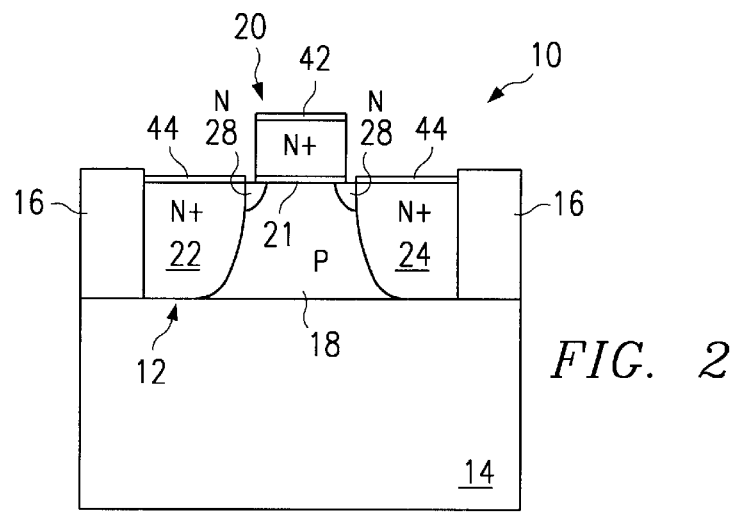
FIG. 2 is a section diagram of the silicon-on-insulator device illustrated in FIG. 1 taken along the line 2—2 of FIG. 1.

FIG. 1 is a diagram illustrating a silicon-on-insulator semiconductor device 10 constructed in accordance with an embodiment of the present invention, and FIG. 2 is a section diagram of semiconductor device 10 illustrated in FIG. 1 taken along the line 2—2 of FIG. 1. In this embodiment, semiconductor device 10 includes a silicon-on-insulator n-MOSFET. However, it should be understood that a p-MOSFET silicon-on-insulator semiconductor device may also be constructed in a similar manner.

Device 10 includes a semiconductor substrate 12 formed over an electrical insulating 14. Insulator 14 may be formed using silicon dioxide or other suitable insulating material. Semiconductor substrate 12 is isolated from adjacent transistor structures by isolation regions 16. Isolation regions 16 may include shallow trench isolation regions or other suitable isolating structures.

As illustrated in FIG. 2, semiconductor substrate 12 is lightly doped with a material having a p-type conductivity in preparation for forming a P-type conductivity body region 18 over insulator 14. A polysilicon region or gate 20 is then formed on an upwardly facing surface of semiconductor substrate 12, which is separated from the upwardly facing surface of semiconductor substrate 12 by a gate insulator layer 21. Gate insulator layer 21 may comprise a layer of silicon dioxide or other suitable insulative materials. Gate 20 may be formed having an H-shaped configuration as illustrated in FIG. 1 however, gate 20 may be formed having a T-shaped or other suitable geometric configuration.

As best illustrated in FIG. 1, gate 20 is formed over semiconductor substrate 14 and defines a source region 22, a drain region 24, and contact regions 26. Contact regions 26 are coupled to body region 18 and are disposed at each end of gate 20. Thus, contact regions 26 provide an electrical contact path to body region 18.

Once gate 20 is formed, a shallow doping cycle is performed with a material having a conductivity substantially opposite the conductivity of body region 18. For example, shallow n-type conductivity regions 28 are formed in semiconductor substrate 12 by lightly doping gate 20, source region 22 and drain region 24 with a material having an n-type conductivity.

Figure 3:
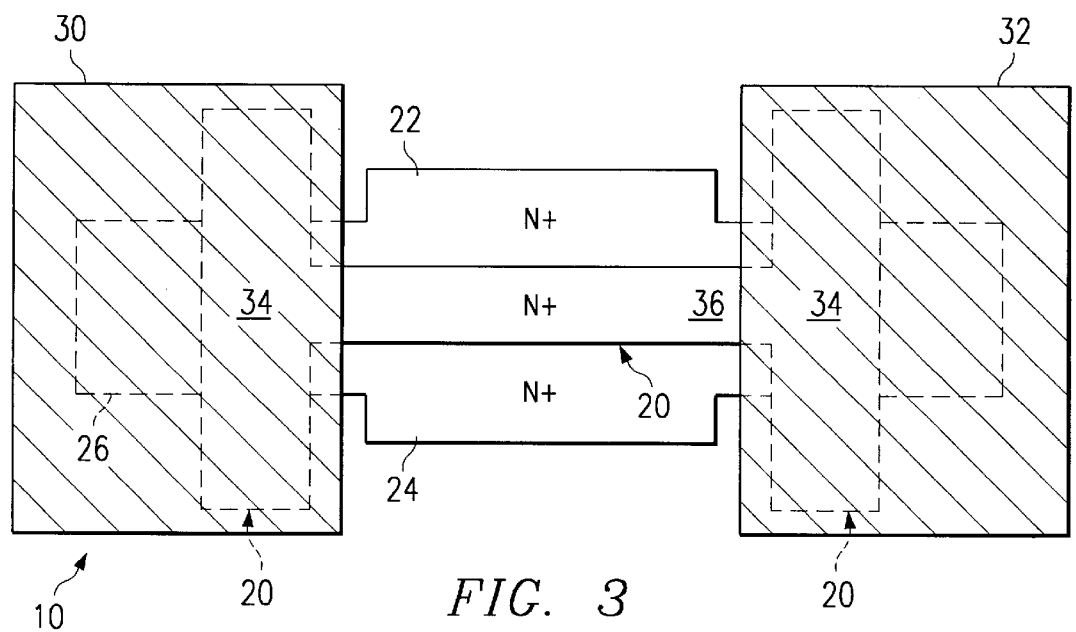
FIG. 3 is a diagram illustrating a mask used in one step of the fabrication of the silicon-on-insulator device according to an embodiment of the present invention.

FIG. 3 is a diagram illustrating masks 30 and 32 for forming device 10 in accordance with an embodiment of the present invention. In operation, device 10 is formed by masking, using masks 30 and 32, an N+ implant from a portion 34 of gate 20 and contact regions 26 during the formation of source region 22 and drain region 24. For example, an unmasked portion 36 of gate 20, source region 22, and drain region 24 are heavily doped with a material having a conductivity type substantially opposite the conductivity type of body 18 to form an N+ type conductivity source region 22, an N+ type conductivity drain region 24, and an N+ type conductivity gate 20 in the unmasked or doped portion 36 of gate 20. Once portion 36 of gate 20, source region 22 and drain region 24 are doped, masks 30 and 32 may be removed and the dopant activated to form the N+ conductivity type source region 22, drain region 24 and portion 36 of gate 20.

Figure 4:
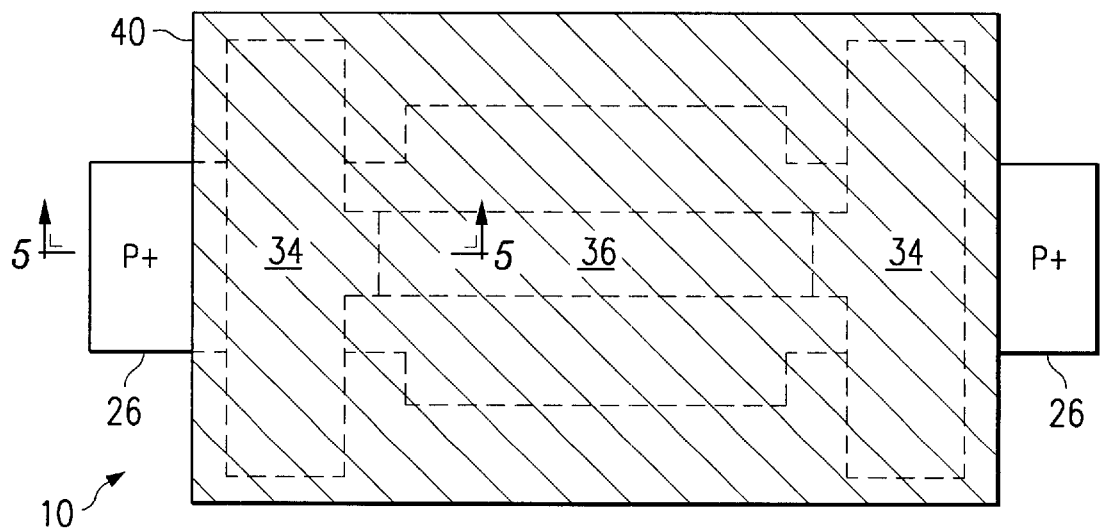
FIG. 4 is a diagram illustrating a mask used in another step of the fabrication of the one step of the fabrication of the silicon-on-insulator device in accordance with an embodiment of the present invention.

FIG. 4 is a diagram illustrating a mask 40 for fabricating device 10 in accordance with an embodiment of the present invention. Once N+ type conductivity material is implanted into unmasked portion 36 of gate 20, source region 22, and drain region 24, masks 30 and 32 may be removed and replaced with mask 40 as illustrated in FIG. 4. Device 10 is further formed by masking, using mask 40, P+ implant material from gate 20, source region 22, and drain region 24. A dopant capable of providing P+ type conductivity is implanted into contact regions 26 of semiconductor substrate 12 to form P+ contact regions 26. Once doped, mask 40 may be removed and the dopant activated to form the P+ type conductivity contact regions 26. Once P+ contact regions 26 are formed, thin silicide layers are formed on upwardly facing surfaces of device 10, as shown diagrammatically at 42 and 44 of FIG. 2.

Figure 5:
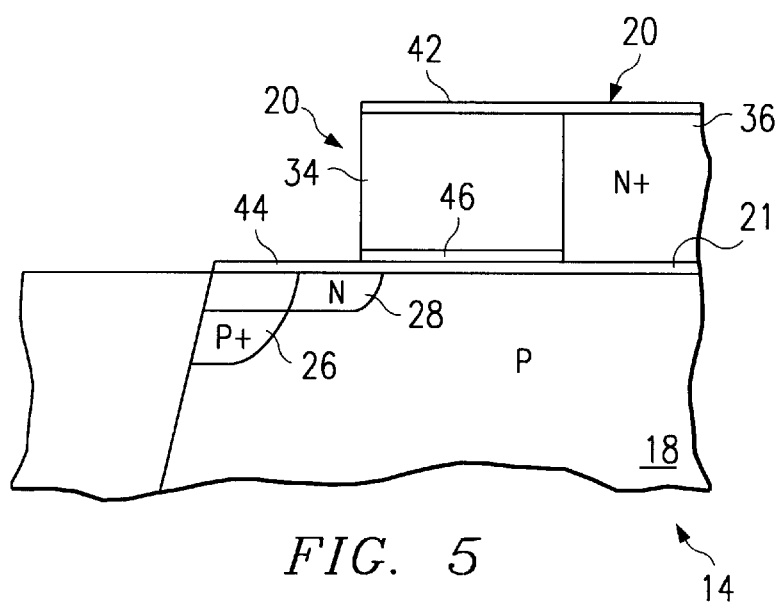
FIG. 5 is a section diagram of the silicon-on-insulator device illustrated in FIG. 4 taken along the line 5—5 of FIG. 4.

FIG. 5 is a section diagram of device 10 illustrated in FIG. 4 taken along the line 5—5 of FIG. 4. As illustrated in FIG. 5, contact regions 26 are doped with a material having a conductivity substantially opposite the conductivity of source and drain regions 22 and 26, respectively, and doped portion 36 of gate 20. Thus, a heavily doped P+ contact region 26 is coupled to body 18 and provides an external contact for body 18 of device 10.

In operation, silicide layer 42 electrically couples undoped portion 34 to doped portion 36 of gate 20. A depletion region 46 of gate 20 proximate gate insulator layer 21 increases the insulation thickness in the region of undoped portion 34 of gate 20, thereby substantially reducing the parasitic capacitance between gate 20 and body 18 in the undoped portion 34 region of gate 20. Therefore, the present invention provides greater efficiency than prior methods and transistors by providing decreased parasitic capacitance in a silicon-on-insulator transistor.

Although the present invention and its advantages have been described in detail, it should be understood that various changes, substitutions, and alterations can be made therein without departing from the spirit and scope of the present invention as defined by the appended claims.

What is claimed is:

1. A method for fabricating a body contact transistor, comprising:
   depositing a semiconductor substrate over an insulator;
   lightly doping the semiconductor substrate to form a body region;
   forming a gate on an upwardly facing surface of the semiconductor substrate and separated from the semiconductor substrate by a gate insulator layer, the gate defining a source region, a drain region on opposing sides of said gate in said body region and a contact region in said body region remote from said source and drain regions;
   masking a portion of the gate disposed over the contact region; and concurrently heavily doping the source region, the drain region and an unmasked portion of the gate with a material having a conductivity substantially opposite a conductivity of the body region while the contact region remains masked.

2. The method of claim 1, further comprising heavily doping the contact region with a material having a conductivity substantially opposite to the conductivity of the source region and the drain region.

3. The method of claim 2, wherein heavily doping the contact region comprises:
   masking the gate, the source region and the drain region; and
   heavily doping the contact region disposed adjacent the masked gate, source and drain regions.

4. The method of claim 1, further comprising lightly doping the source region, the drain region, the gate region and the contact region with a material having a conductivity substantially opposite a conductivity of the body region after forming the gate and before heavily doping the source region, the drain region and the unmasked portion of the gate.

5. The method of claim 1, wherein the contact region is disposed adjacent an end of the gate.

6. The method of claim 1, wherein forming the gate comprises forming a first region and a second region of the gate, the source region and the drain region formed on either side of the first region of the gate, the second region of the gate disposed at an end of the gate and adjacent the contact region, and wherein heavily doping the unmasked portion of the gate comprises heavily doping the first region of the gate.

7. The method of claim 1, wherein forming the gate comprises:

forming a first region of the gate, the source region and the drain region disposed on either side of the first region; and forming a second region of the gate substantially perpendicular to and disposed at an end of the first region; and wherein heavily doping the unmasked portion of the gate comprises heavily doping the first region of the gate.

8. A method for fabricating a body contact transistor, comprising:

providing a semiconductor structure having a semiconductor substrate formed over an insulator;

lightly doping the semiconductor substrate to form a body region;

forming a gate on an upwardly facing surface of the semiconductor substrate and separated from the upwardly facing surface of the semiconductor substrate by a gate insulator layer, the gate defining a source region, a drain region on opposing sides of said gate in said body region, and a contact region coupled to said body region remote from said source and drain regions;

masking the contact region and a portion of the gate disposed over the contact region; and concurrently heavily doping the source region, the drain region and an unmasked portion of the gate with a material having a conductivity substantially opposite a conductivity of the body while the contact region remains masked.

9. The method of claim 8, further comprising heavily doping the contact region with a material having a conductivity substantially opposite the conductivity of the source region, the drain region and the unmasked portion of the gate.

10. The method of claim 8, wherein masking the portion of the gate comprises masking the portion of the gate disposed adjacent the source and drain regions.

11. The method of claim 8, wherein the contact region is disposed adjacent a periphery of the gate.

12. The method of claim 8, wherein the masked portion of the gate is disposed between the contact region and the source and drain regions.

13. A method for fabricating a body contact transistor, comprising:

providing a semiconductor structure having a semiconductor substrate formed over an insulator;

lightly doping the semiconductor substrate to form a body region;

forming a gate on an upwardly facing surface of the semiconductor substrate and separated from the upwardly facing surface of the semiconductor substrate by a gate insulator layer, the gate defining a source region, a drain region, and a contact region, the contact region coupled to the body region;

masking the contact region and a portion of the gate disposed adjacent the contact region; and heavily doping the source region, the drain region and an unmasked portion of the gate with a material having a conductivity substantially opposite a conductivity of the body;

wherein the masked portion of the gate is disposed between the contact region and the source and drain regions;

wherein forming the gate comprises:

forming a first region of the gate, the source region and the drain region disposed on either side of the first region; and forming a second region of the gate substantially perpendicular to and disposed at one end of the first region; and wherein masking the portion of the gate adjacent the contact region comprises masking the second region of the gate.

\* \* \* \* \*